United States Patent
Kitko et al.

(10) Patent No.: US 6,529,715 B1
(45) Date of Patent: Mar. 4, 2003

(54) AMPLIFIER ARCHITECTURE FOR MULTI-CARRIER WIDE-BAND COMMUNICATIONS

(75) Inventors: Stephen Douglas Kitko, Newton, NJ (US); Hans A. Kvinlaug, Bradford, MA (US); Richard Joseph Lisco, Bradford, MA (US); William A. Nitz, Rockaway, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/259,660

(22) Filed: Feb. 26, 1999

(51) Int. Cl.[7] .................................................. H03F 3/68
(52) U.S. Cl. ..................... 455/103; 330/295; 330/124 R
(58) Field of Search ............................. 330/124 R, 286, 330/295, 149, 296, 297; 455/101, 102, 103; 370/339; 375/296, 297

(56) References Cited

U.S. PATENT DOCUMENTS

| | | | | |
|---|---|---|---|---|
| 5,180,999 A | * | 1/1993 | Edwards | ...................... 333/175 |
| 5,764,104 A | * | 6/1998 | Luz | ........................ 330/124 R |
| 5,783,969 A | * | 7/1998 | Luz | ........................ 330/124 R |
| 5,834,972 A | * | 11/1998 | Schiemenz et al. | ..... 330/124 R |
| 5,894,250 A | * | 4/1999 | Ravaska et al. | ............. 333/134 |
| 6,243,038 B1 | * | 6/2001 | Butler et al. | ................. 342/373 |

* cited by examiner

Primary Examiner—Thanh Cong Le
Assistant Examiner—Andrew T Harry
(74) Attorney, Agent, or Firm—Law Offices of John Ligon

(57) ABSTRACT

A methodology is provided for processing carriers in a wireless application whereby the outputs of a multiplicity of modulated RF signal sources are combined into a single RF signal stream, that single RF signal stream being thereafter divided among the inputs of another multiplicity of RF power amplifiers. The outputs of that multiplicity of RF power amplifiers are then recombined, filtered and provided as an input to a transmission antenna.

13 Claims, 13 Drawing Sheets

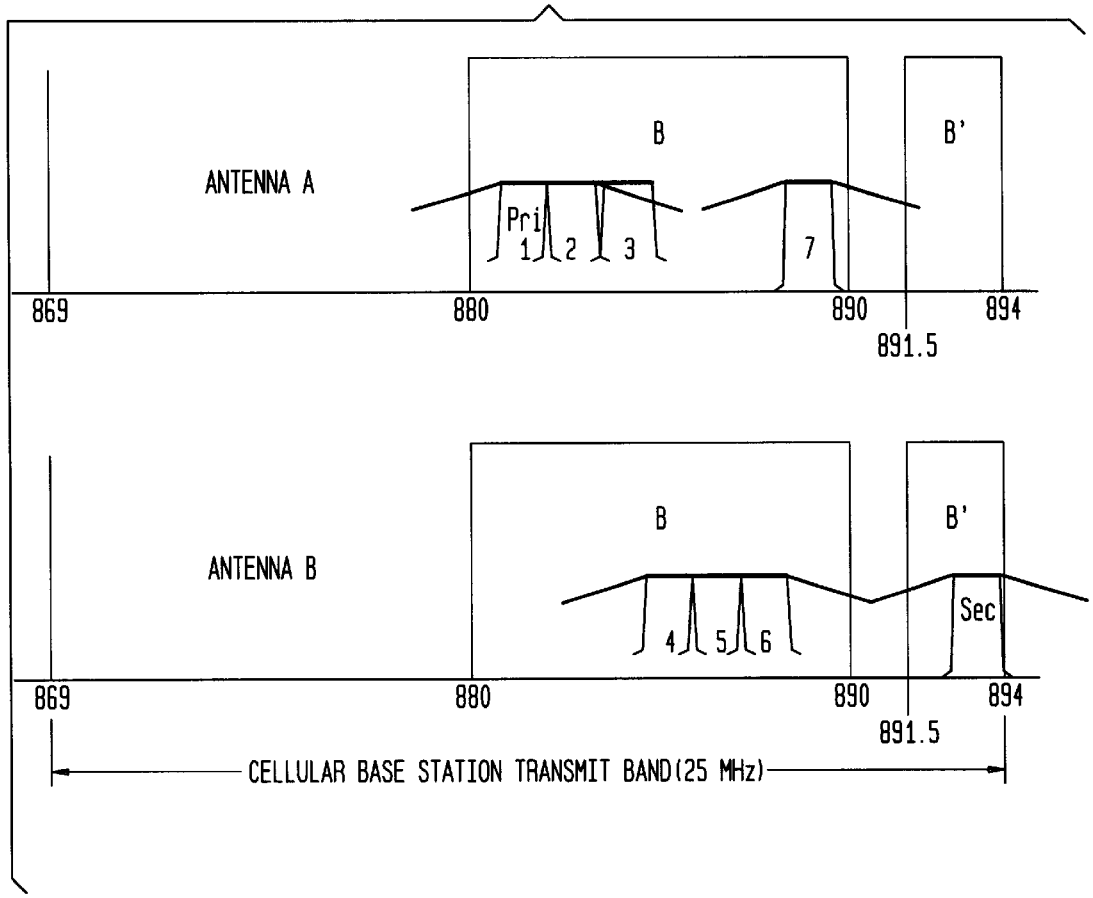

AMPLIFIER ARCHITECTURE FOR MULTI-CARRIER WIDE-BAND COMMUNICATIONS

FIELD OF THE INVENTION

This application is related to the art of wireless communications and more particularly to transmission for wideband wireless systems.

BACKGROUND OF THE INVENTION

In a wireless communications system, a given base station will generally be established to serve a number of mobile communications stations located within the serving area of that base station. Each such base station is assigned a set of communications channels developed from a portion of the radio frequency spectrum assigned to the particular wireless service provided via the base station—which assignment function may be dynamic. For each of such channels, the function of transmitting information intended to be received by a designated mobile station is generally distributed among four transmission components: (1) a set of electronics carrying out the function of modulating the communications signal onto a carrier signal (hereafter referred to as a "radio"); (2) an RF power amplifier for increasing the power of radio frequency signals, such amplifier being designed to avoid adding significant distortion products; (3) a transmit filter for attenuating residual harmonics and other RF emissions outside the desired transmit frequency; and (4) a transmission antenna.

Because of various constraints—e.g., cost, esthetic, zoning, etc.—it is often considered desirable to minimize the number of antennas for the transmission of multiple communications channels served by a given base station. In large systems where these multiple communications channels are transmitted using more than one RF signal (or carrier), such an arrangement necessarily requires that the RF signals representing those multiple channels be combined prior to reaching the antennas serving those channels. Various arrangements are known in the art for accomplishing such combining, and the combining equipment selected will have a significant effect on the design of the RF amplifiers within the system. Two of the more commonly used methods may be described as Individual Carrier Linear Amplifier (ICLA) systems and Multiple Carrier Linear Amplifier (MCLA) systems. Salient characteristics, and differences, for each of those systems are described briefly below.

An exemplary (and somewhat simplified) ICLA system is schematically illustrated in FIG. 1. As can be seen from the figure, each radio 101 has it's own dedicated amplifier 102, with the outputs of the amplifiers being combined in a broadband RF combiner 103 and sent to the transmit filter 104 and antenna 105. The combiner must provide sufficient port-to-port isolation to prevent generation of spurious products due to leakage of signals between ports of the combiner and subsequent mixing of the signals in the amplifiers. When each ICLA amplifier is designed to meet all in-band spurious emission requirements (within the service provider's licensed transmit band), and assuming sufficient port-to-port isolation in the combiner, only one transmit band filter is required at the output of the combiner to limit out-of-band emissions. This provides flexibility since carriers (channels) can be added or moved without the need to change or add filters. The price of this flexibility is high, however, since the overall system efficiency with this arrangement is poor in systems with large numbers of carriers. The reason for the poor system efficiency is that the individual RF carriers are combined in a broadband combiner at high power levels after amplification. Broadband RF power combiners are very inefficient when combining multiple signals at different frequencies. In fact, the signal loss from the input to the output of a typical broadband combiner is proportional to the number of signals being combined. For an N-to-1 combiner, the power loss per signal is equal to $(N-1)/N$.

For the 4-to-1 combiner shown in FIG. 1, three-fourths of the output of each amplifier is dissipated in the combiner, which leaves only one-fourth of the amplifier output power for the antenna. Broadband combined ICLA configurations are therefore best suited for systems operating at low power levels and/or with low numbers of carriers.

In order to combine the outputs of ICLA amplifiers without excessive losses, it is common practice to frequency isolate their outputs by passing them through individual bandpass filters prior to combining. This narrowband combining prevents the high losses which would otherwise occur in a system using broadband RF combiners. Note, however, that for a given filter selectivity, the passbands of these filters must be sufficiently separated in frequency in order to effectively reduce the combining losses. Since the individual filters are tuned to specific frequencies it is difficult to re-configure or grow such a system without extensive filter replacement and re-cabling. Although remotely tunable combiners are available, these are generally more complicated and expensive than fixed-tuned combiners, with complexity and cost increasing as the passband signal bandwidth increases.

An exemplary MCLA system is schematically illustrated in FIG. 2. As can be seen in that figure, with the MCLA approach, the outputs of the individual radios 201 are combined in a broadband RF combiner 202 prior to amplification. This multi-carrier signal is then amplified by the MCLA amplifier 203 and passed through a transmit filter 204 prior to being sent to the antenna 205.

The MCLA amplifiers are designed to meet all spurious emission requirements within the service provider's licensed transmit band, and therefore, only one transmit band filter is required to limit out-of-band emissions. This provides additional flexibility since carriers (channels) can be added or moved without the need to change or add filters. The price of this flexibility is high, however, since amplifiers of this type are more complicated and expensive than amplifiers which only process one RF carrier.

One of the important characteristics of an MCLA amplifier is that it is capable of processing a large number of RF signals simultaneously while still maintaining low intermodulation distortion. Thus, an MCLA amplifier provides more flexibility than the ICLA approach since any number of carriers may be amplified by a single amplifier, as long as the cumulative output power remains below the average output power rating of the amplifier. Also, since the carriers are combined at low power levels prior to amplification, power loss due to combining signals at different frequencies is reduced. However, the MCLA amplifier is typically less efficient than its ICLA counterpart, since it must operate further below the saturation level than the ICLA amplifiers in order to maintain intermodulation distortion products at an acceptably low level. MCLA amplifiers also typically employ feed-forward linearization circuitry to further reduce intermodulation distortion, which increases the size and cost of the MCLA amplifier.

SUMMARY OF THE INVENTION

An object of the invention is accordingly a low cost RF amplifier architecture for multi-carrier, wide-band wireless applications. To that end a methodology is disclosed for processing carriers in a wireless application whereby the outputs of a multiplicity of modulated RF signal sources are combined into a single RF signal stream, that single RF signal stream being thereafter divided among the inputs of another multiplicity of RF power amplifiers. The outputs of that multiplicity of RF power amplifiers are then recombined, filtered and provided as an input to a transmission antenna. According to the method of the invention, the RF amplifiers are selected to meet a set of predetermined spurious emission requirements and are established in a cooperative relationship with the transmit filter in order to provide amplified output signals meeting in-band spurious emission requirements.

BRIEF DESCRIPTION OF THE DRAWINGS

FIG. 14 shows a frequency plan for the system of FIG. 13.

DETAILED DESCRIPTION OF THE INVENTION

As shown by the discussion in the Background section of prior art methods for combining RF signals in a wireless communications system, the choice of an MCLA or ICLA amplifier arrangement represents a system tradeoff between filter and amplifier complexity. In an MCLA system, the amplifier design is more complex, but only one broadband filter is required, which allows greater flexibility in carrier placement and growth. With a narrowband ICLA system, on the other hand, the amplifiers are simpler than those of an MCLA system, but at the expense of a more complicated filtering system with many different filters, each tuned to a specific carrier frequency. Although a broadband combiner may be used to combine the outputs of ICLA amplifiers, this approach is generally not practical for high power systems due to the losses incurred in the combiner when combining multiple signals at different frequencies.

A new wireless system architecture is disclosed herein which operates to preserve much of the flexibility and growth options of MCLA systems while at the same time processing carriers in groups small enough to reduce the amplifier cost. The methodology underlying this new architecture is described hereafter in the context of a wireless system based on the use of a code division multiple access (CDMA) channelization arrangement, and will be seen to be particularly advantageous for use in a CDMA system. However, as will be apparent to those skilled in the art, the methodology of the invention is applicable to other coding and multiplexing arrangements employing multiple RF carriers, including arrangements involving different bandwidths than those illustrated in the examples provided herein.

As a perspective for discussion of the methodology and architecture of the invention, it is usefull to initially consider certain facets of a narrowband ICLA system which might be found in a wireless application. It was previously noted that, in order to combine the outputs of ICLA amplifiers without excessive losses, their outputs must first be frequency isolated by passing them through individual filters prior to combining. This prevents the high losses which would otherwise occur in a system using broadband RF combiners. However, for a given filter selectivity, the passbands of these filters must be sufficiently separated in frequency in order to provide the isolation required to effectively reduce the combining losses.

Figure 1:
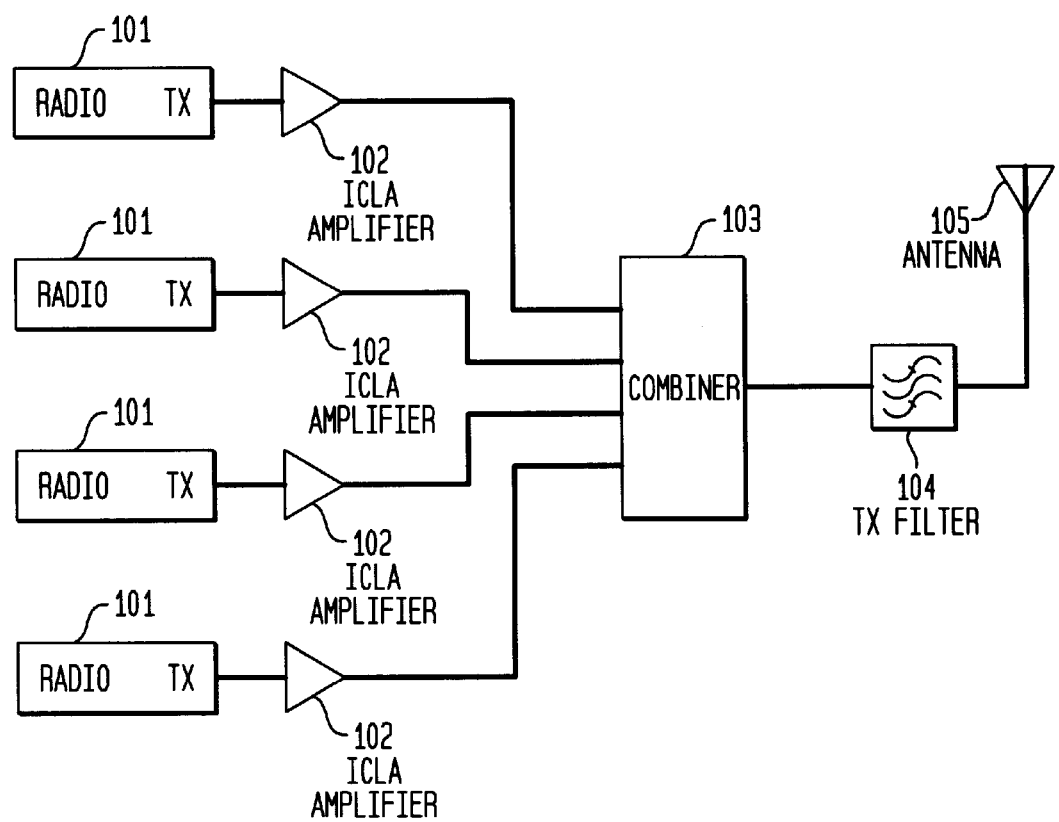
FIG. 1 shows schematically an illustrative RF transmit path based on use of ICLA amplifiers and a broadband RF combiner.
Figure 2:
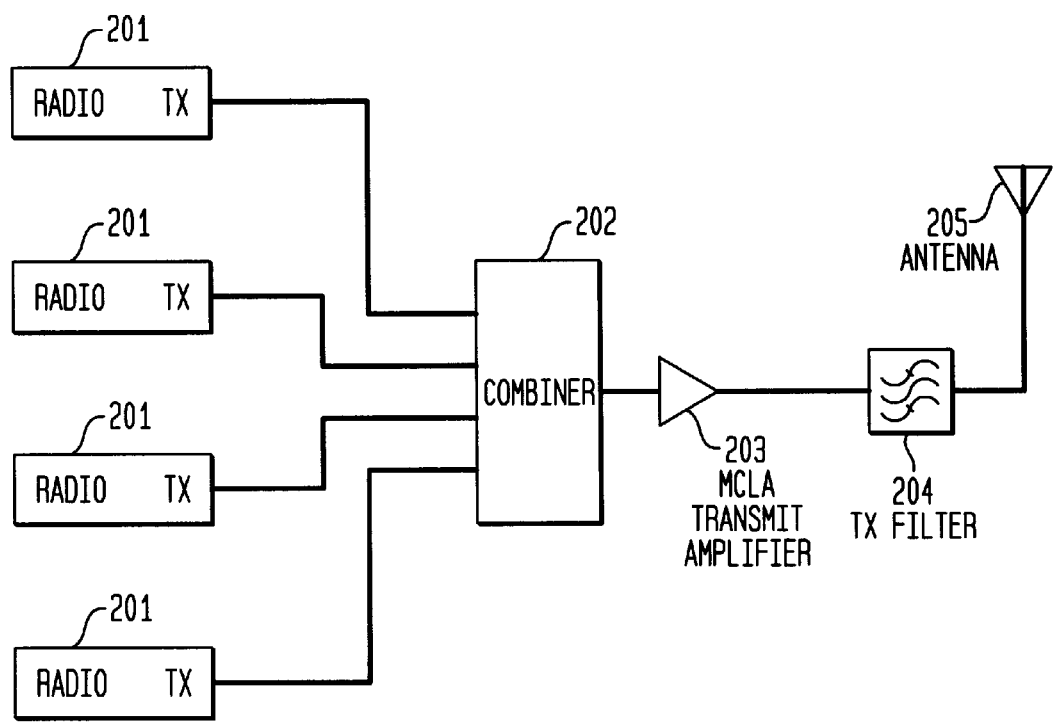
FIG. 2 shows schematically an illustrative RF transmit path based on use of MCLA amplifiers.
Figure 3:
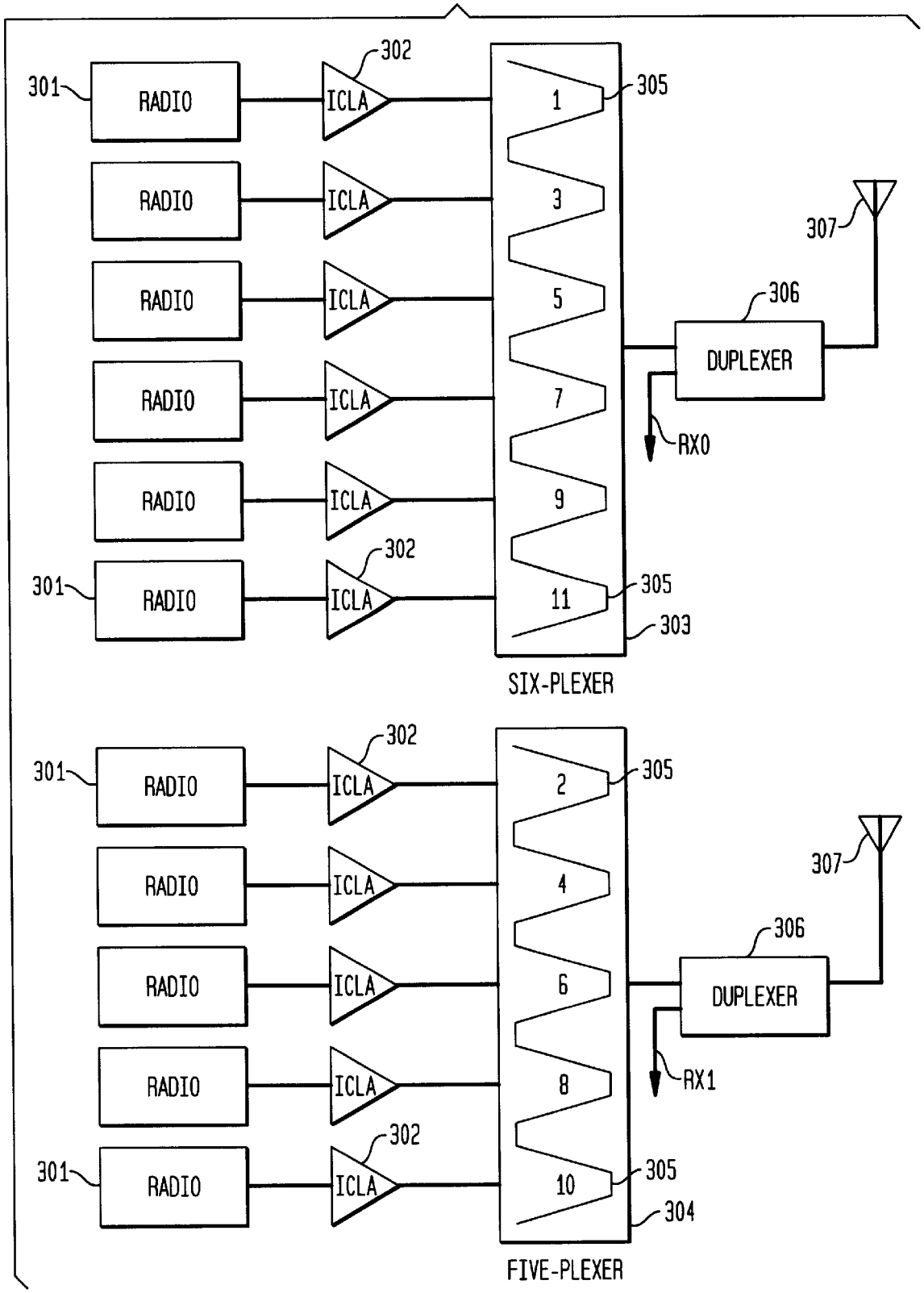
FIG. 3 shows schematically an eleven carrier fixed-tuned CDMA amplifier system using ICLA amplifiers and narrowband filter combiners.

An illustrative such ICLA system is shown schematically in FIG. 3 and includes two banks of Radios 301, with each radio providing an output to an ICLA Amplifier 302, and the outputs of the amplifiers being fed to one of two Narrowband Combiners (designated Six-plexer 303 or Five-plexer 304). As shown in the figure, each of the combiners includes a number of Bandpass Filters 305 (designated by numerals 1, 3, 5, 7, 9, 11 or 2, 4, 6, 8, 10), there being a one-to-one correspondence between filters and the radio/amplifier sets served. The outputs of the combiners are connected to the Antennas 307 via Duplexers 306 which operate to provide isolation between the transmit and receive signals, thereby allowing them to share a common antenna. (The Duplexers also contain receive band filters as well as any additional transmit band filtering required to further reduce the out-of-band spurious emissions of the transmitter system to an acceptable level.) As previously stated, it is desirable to minimize the number of antennas in a wireless system in order to reduce the cost and complexity associated with deploying the antennas and antenna towers. Increasingly stringent zoning requirements and aesthetic considerations are providing further incentives for service providers to reduce their antenna counts. In this regard, a minimum of two antennas is typically required in most modern cellular communications systems in order to provide adequate receive path diversity.

Figure 4:
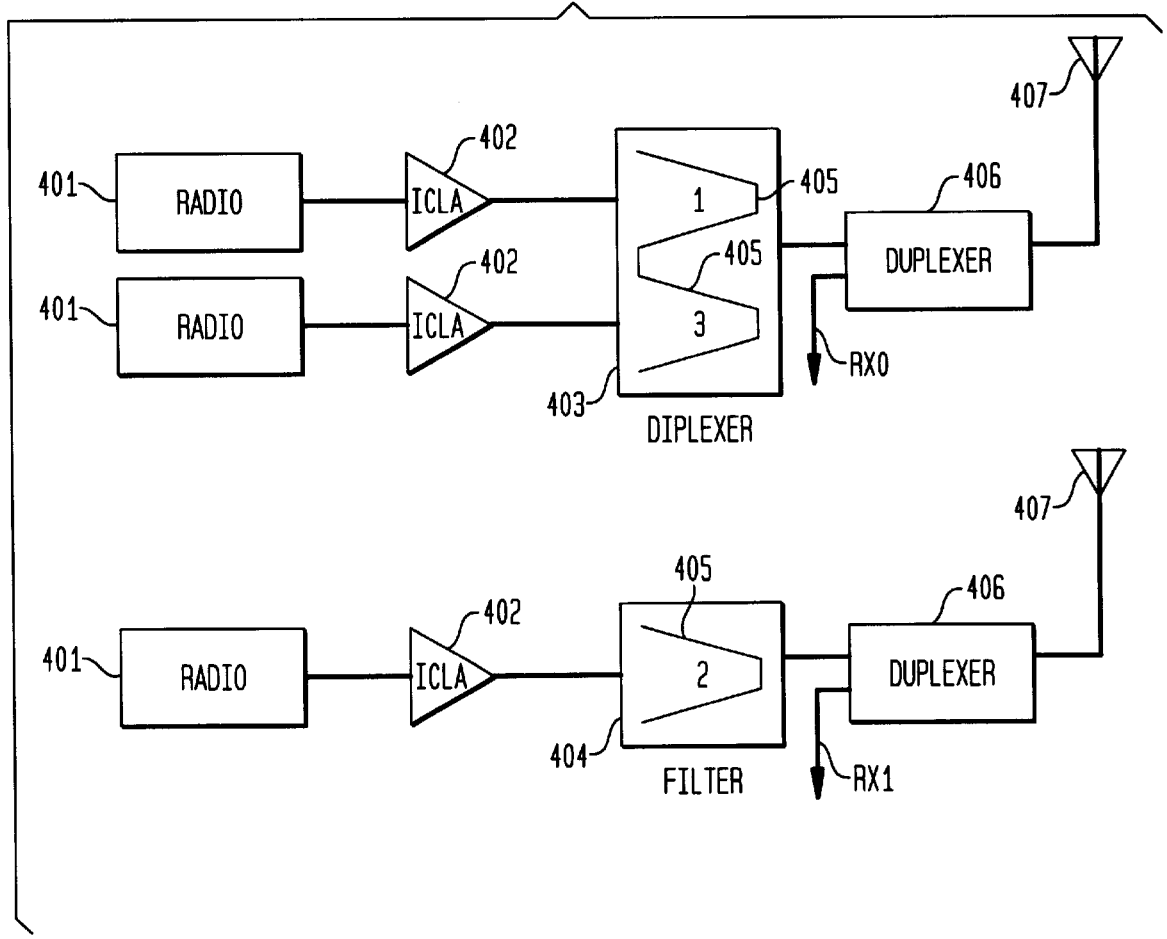
FIG. 4 shows schematically a three carrier CDMA amplifier system using ICLA amplifiers and narrowband combiners.

The filter passbands contained within the narrowband combiners for a system such as illustrated in FIG. 3 are separated by 2 times the CDMA carrier bandwidth—the standard CDMA wireless carrier bandwidth being 1.25 MHz, and, thus, for such a case, the separation will be 2.5 MHz. Therefore, with this type of system, each antenna in a 2 antenna system can only transmit alternate CDMA carriers. This is illustrated in the figure by the alternate channel numbers designating each of the filter passbands. As will be seen, the system shown in FIG. 3 depicts an 11 carrier CDMA system, which would be appropriate to a 15 MHz wide wireless frequency band, such as has been established for the U.S. PCS system. A similar arrangement for a 3 carrier system, using a 5 MHz wide frequency band (as also used in the U.S. PCS system), is shown in FIG. 4. (The "400" series reference numbers of FIG. 4 correspond in the units position to the equivalent devices of FIG. 3.)

The large number of narrowband filters required by a narrowband ICLA system makes the filtering more complicated than in an MCLA system, which needs only a single broadband transmit filter. And, since the individual filters are tuned to specific carrier frequencies, it is difficult to re-configure or grow such a system without extensive filter replacement and re-cabling. MCLA systems, on the other hand, provide a means for combining multiple carriers onto a single antenna with only one transmit filter; but MCLA amplifiers are generally more complicated and expensive than ICLA amplifiers since they must process multiple signals over a wide bandwidth while maintaining intermodulation distortion at an acceptably low level.

I. Description of an Illustrative Embodiment

The inventors have developed a new architecture for processing the RF carriers in a multi-carrier wireless system. That architecture blends ICLA and MCLA technology to operate on a group of carriers which is small enough to avoid a good deal of the complexity and expense of MCLA hardware, while at the same time preserving much of the flexibility otherwise associated with MCLA architectures. For notational convenience, the multi-carrier amplifier system implemented according to the architecture of the invention will be designated hereafter as an Ultra-ICLA (or "ULA") system.

As a predicate to a detailed discussion of that methodology and architecture of the ULA system, it is worthwhile to briefly consider certain spectral characteristics of the CDMA signal which are useful to the new carrier processing architecture of the invention. Due to the wideband nature of the CDMA signal, spurious emissions generated by an amplifier processing multiple CDMA carriers on adjacent channels do not appear as discrete intermodulation products separated from the main carriers. Rather, these spurious emissions appear as increased spreading at the edges of the carriers.

As described below, this property of the CDMA signal can be exploited to advantage in the design of an amplifier system to process groups of adjacent CDMA carriers. Since linear amplifier cost and/or performance also tends to improve as the occupied bandwidth decreases, the cost and complexity of these ULA amplifiers will generally be lower than that of MCLA amplifiers processing signals occupying a wider total bandwidth.

Figure 5A:
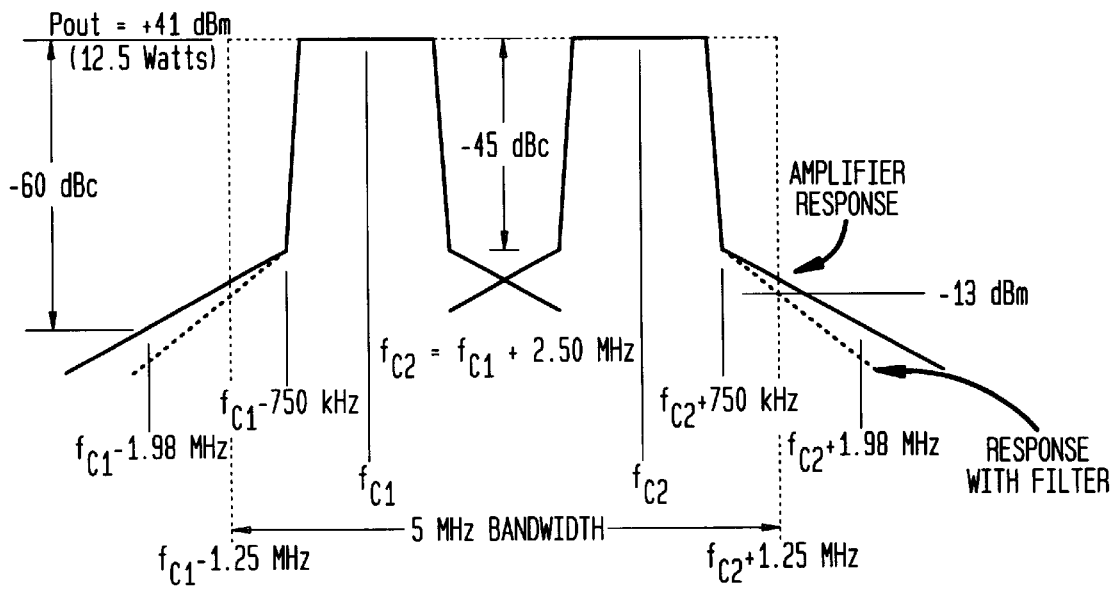
FIGS. 5A–5C show ways in which multiple CDMA carriers can be combined according to the method of the invention.
Figure 5B:
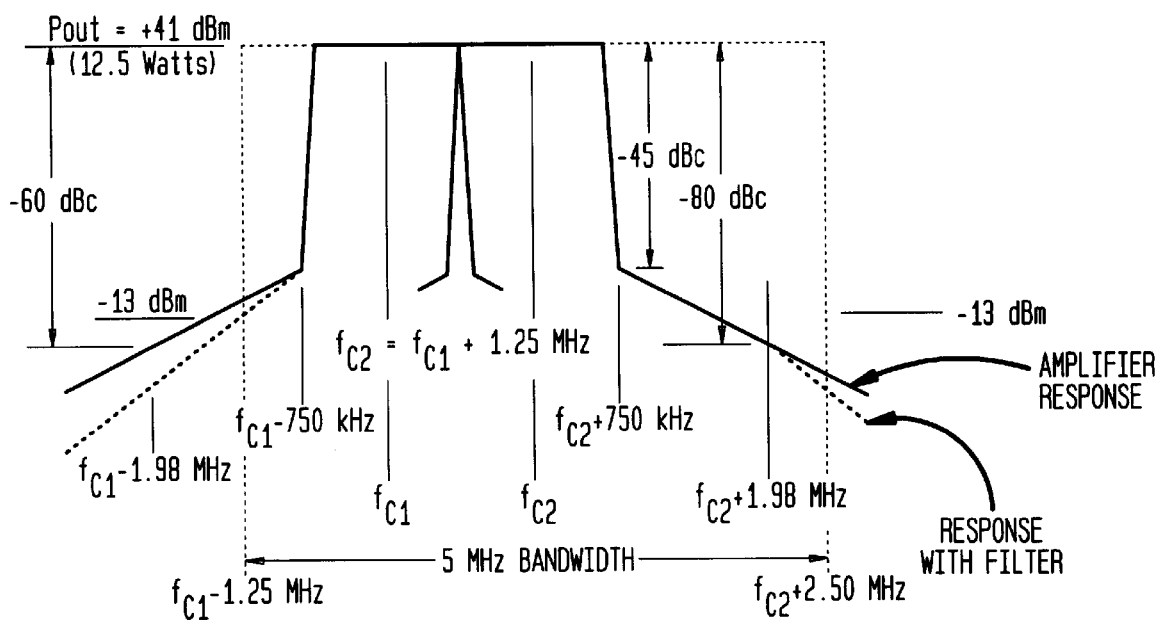
Figure 5C:
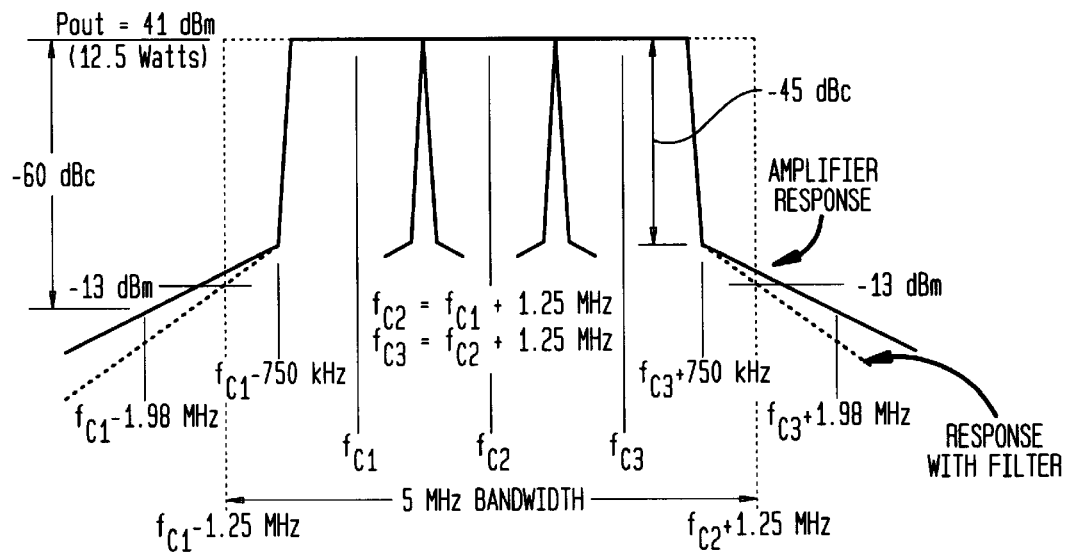

FIGS. 5A–5C show three different ways in which multiple CDMA carriers can be combined within a 5 MHz bandwidth. In these figures the actual carriers occupy a maximum of 3.75 MHz of bandwidth and a 3.75 MHz bandpass filter is used; the additional 1.25 MHz is used as a guard band.

FIG. 5A shows the case of two carriers separated by 2.5 MHz. In this scenario, separate intermodulation products (IMDs) will be generated at 2.5 MHz from each carrier; however, these IMDs fall outside of the filter passband and will be attenuated to an acceptable level prior to reaching the antenna. The amplifiers will need to meet in-band spurious emission requirements established by standards and/or regulatory requirements for the wireless system under consideration—which for the IS-95 standard will be: −45 dBc at ±750 kHz from the carrier center frequencies. The combined amplifier and filter response must also meet the out-of-band emission requirements.

FIG. 5B shows the case of two carriers placed adjacent to each other at one end of the 5 MHz band. For this scenario, in addition to the requirements described above, the amplifiers, by themselves, must be able to meet the in-band spurious emission requirements at the far edge of the band—which for the IS-95 standard will be—60 dBc at 1.98 MHz from the right-most carrier center frequency for this illustrated case.

FIG. 5C shows the case of three carriers placed adjacent to each other across the 5 MHz band. The in-band and out-of-band spurious emission requirements are the same as those outlined above.

In a preferred embodiment, the method and architecture of the invention will be applied to the provision of a CDMA channelization arrangement for a PCS-type wireless communications system, such as the U.S. PCS system. Hereafter, the invention will be described from the perspective of that preferred embodiment.

Figure 6:
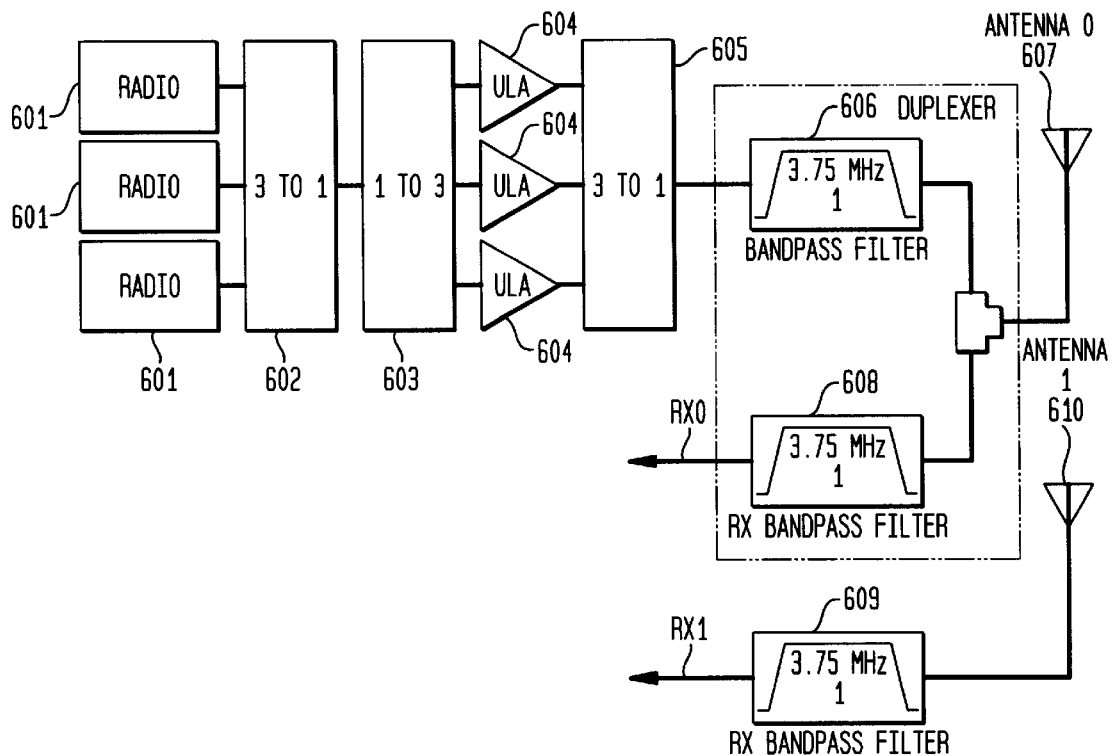
FIG. 6 shows schematically an implementation of an amplifier system according to the method of the invention for a 5 MHz PCS band system.

A block diagram of the hardware implementation for a 5 MHz PCS band system using ULA amplifiers is shown in FIG. 6. The outputs of 3 CDMA radios Radio 601 are combined in 3-To-1 Combiner 602 and fed to a parallel combination of three ULA Amplifiers 604. The output signal from the 3-to-1 Combiner is split by a 1 To 3 Splitter 603 to feed the three ULA Amplifiers and then recombined following amplification by an output 3 To 1 Combiner 605. The splitter, combiner, and amplifiers are matched such that no power is lost in the output combiner aside from insertion loss. The combined amplifier output signal is then passed through a bandpass, 3.75 MHz wide Transmit Filter 606 on its way to the Antenna 607. The transmit filter and a corresponding Receive Filter 608 are combined in a duplex configuration on one antenna. A simplex Diversity Receive Filter 609 is used on the other Antenna 610.

Figure 7:
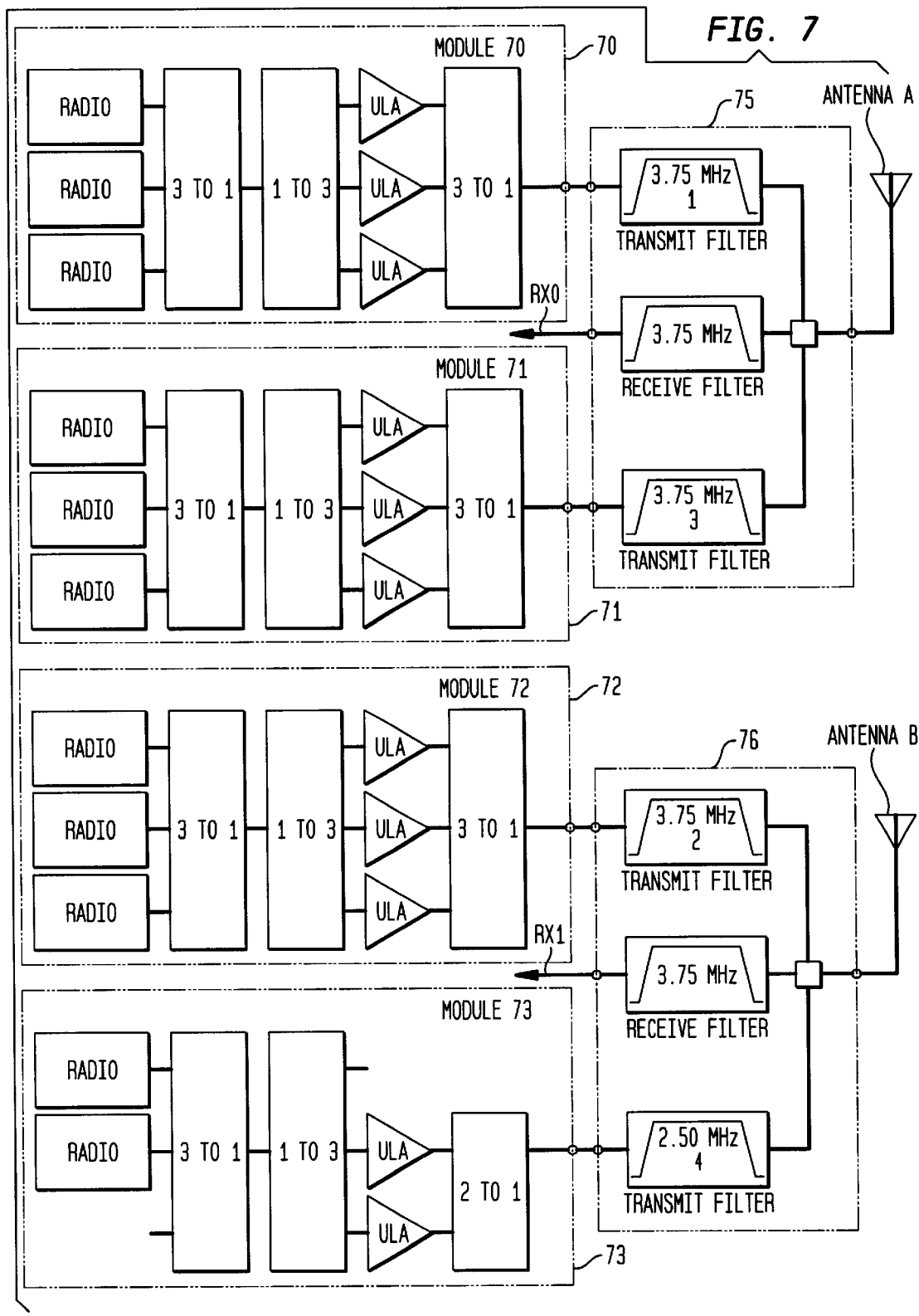
FIG. 7 shows a PCS system configuration for a 15 MHz PCS frequency block.

FIG. 7 shows a PCS system configuration and growth scenario for a 15 MHz frequency block according to the method of the invention. As can be seen in the figure, the 3-radio/3-amplifier architecture described in conjunction with FIG. 6 becomes essentially a ULA module, as indicated inside the dashed outline 70 (labeled Module 70), and growth in system capacity is accomplished by replication of that module to accommodate additional channels as required, such growth module being indicated by dashed outlines 71, 72 and 73 (enclosing Modules 71, 72 and 73). Triplexers 75 & 76 operate to combine two groups of amplifiers—i.e., two ULA modules, onto the same antenna output along with a receiver input for that antenna. In this way, a maximum of 11 CDMA carriers can be placed in a 15 MHz frequency block using 2 antennas.

Considering this ULA growth scenario in the context of an actual PCS base station, a reasonable and relatively efficient hardware implementation would involve each triplexer and its associated filters being built onto a single filter panel. Primary frames containing the triplex filter panels would be deployed first, followed by their respective growth frames, which would rely on the primary frames for filtering. Other configurations permitting more modular filter growth will of course be understood to those skilled in the art, as well as the deployment of various combinations of duplex and simplex filter panels (although the latter would need to be changed out as the system grows).

Note that in the final ULA Module 73 in FIG. 7, where only 2 ULA amplifiers are deployed, rather than 3, it is also necessary to change the amplifier combiner from a 3:1 to a 2:1 configuration. This is true in general; any configuration which combines the outputs of N amplifiers requires the use of an N:1 combiner. Therefore, as the size of the system grows, the amplifier combiner must change from no combiner, to a 2:1 combiner, and finally to a 3:1 combiner. This can be done by either physically changing combiners or by constructing a growable combiner system. Also note that the combiners and splitters deployed between the radios and amplifiers do not need to be re-configured since the additional power loss at the low RF levels experienced before amplification is generally not considered significant and gain differences between combiners can be compensated for by adjusting the radio output power levels.

Figure 8:
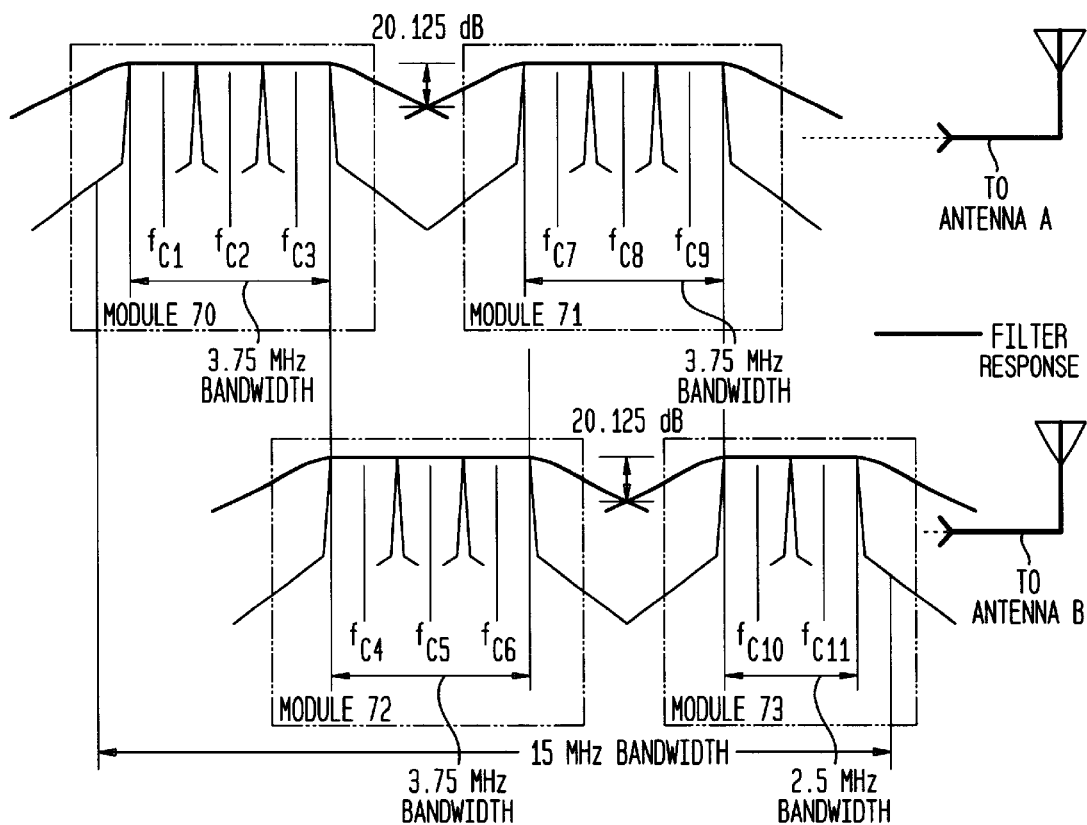
FIG. 8 shows an illustrative frequency plan for the 15 MHz system shown in FIG. 7.

FIG. 8 shows an illustrative frequency plan for the 15 MHz, 11 carrier PCS system shown in FIG. 7. It should be noted again that adjacent groups of carriers are placed on different antennas in order to provide sufficient frequency isolation in the triplexers.

As can be seen in the figure, the filter response for the last two carriers is narrower than that for the other carriers (in Modules 70, 71, & 72). This filter response is intended to maximize the isolation in the triplexers. In circumstances where the isolation requirements for the triplexers can be relaxed, or with the use of filters having a steeper roll-off, this last filter section can be designed with the same bandwidth as that for the preceding carriers.

II. An Alternative Embodiment

A. Application to U.S. Cellular System

ICLA amplifiers designed to meet IS-95 CDMA requirements for systems employing narrowband combining architectures are typically not compatible with the expanded spectrum portion of the US domestic 850 MHz Cellular service band (the A', A" and B' sub-bands), since the edges of these sub-bands fall into transition bands specified for the IS-95 system. Many such amplifiers are not designed to meet band-edge spurious emission requirements without the aid of additional filtering and guard band. Given the narrowband nature of the domestic 850 MHz expanded spectrum, provision of CDMA channels within the expanded spectrum requires that a highly linear amplifier be used in order to comply with out-of-band emission requirements established by regulatory and standards bodies.

Figure 9:
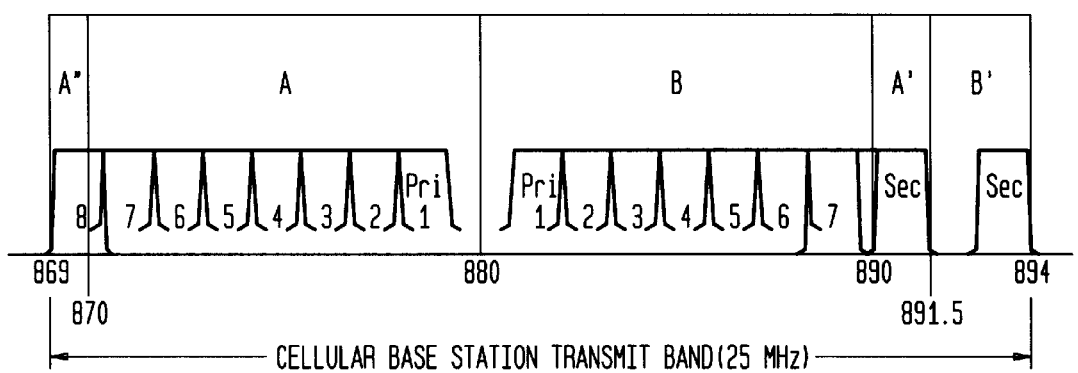
FIG. 9 shows the U.S. cellular transmit frequency spectrum allocation and the typical placement of CDMA carriers within that spectrum.

The difficulty in implementing CDMA using narrowband ICLA architectures for the U.S. domestic cellular system will be more readily understood with reference to FIG. 9, which shows the U.S. cellular transmit frequency spectrum allocation along with the standard CDMA carrier locations. Under the current CDMA wireless standard (IS-95), two CDMA carriers are designated as the Primary and Secondary carriers in each of the A and B bands. Since the CDMA mobile requires that either the primary or secondary carrier be present in order to set up a call, all 850 MHz CDMA systems must begin deployment with at least one of these carriers.

The primary carriers (#s 1–7 in A-band and #s 1–6 in B-band) are each located far enough from the edges of their respective bands ($f_c \pm 1.5$ MHz) that a relatively simple 3.75 MHz bandwidth transmit filter can easily provide enough additional attenuation to meet out-of-band emission requirements using the methodology of the invention with ULA amplifiers processing groups of three carriers. In contrast, the edges of the secondary carriers are so close to the A' and B' band edges that a practical transmit filter does not provide any appreciable attenuation at the band edge. Therefore, the out-of-band emission requirements must be met by the amplifier alone, which is accomplished by dedicating a stand-alone ULA amplifier to each of the secondary carriers.

[The preferred ULA amplifier, as discussed below, is expected to meet all in-band and out-of-band spurious emission requirements when operating with 1 carrier at ⅓ its rated output power.] This requirement is illustrated by the relatively steeper skirts on the secondary carriers in FIG. 9 as compared to the majority of the A and B band carriers.

An additional complicating factor is that, in order to completely fill the A/A" or B band, the last carrier in each band must be placed so closely to the band edge that a stand-alone ULA amplifier must be dedicated to that carrier as well. These carriers are labeled 8 and 7 in the A/A" and B bands, respectively. In practice, this will not be as important a consideration as for the A' and B' secondary carriers, since a cellular service provider would have to have reached the point of converting its entire band to CDMA before it becomes necessary to address this limitation. Since analog cellular service is expected to continue to be provided for the foreseeable future, a need for these end-of-band channels (for CDMA service) may be considerable in the future.

B. Implementation Options

It is expected that, in an application of the method and architecture of the invention for a U.S. domestic cellular system, the system will be implemented in a 3-Sector/3-Carrier frame structure. Given that premise, the cellular band growth path must support various combinations of primary and stand-alone secondary carriers in 3-carrier segments. Specifically, each sector of the frame may be configured to support either a) three dedicated ULA amplifiers, b) one dedicated ULA amplifier and two 2-carrier ULA amplifiers, or c) three 3-carrier ULA amplifiers. These three possibilities are depicted schematically in FIG. 10.

Figure 10A:
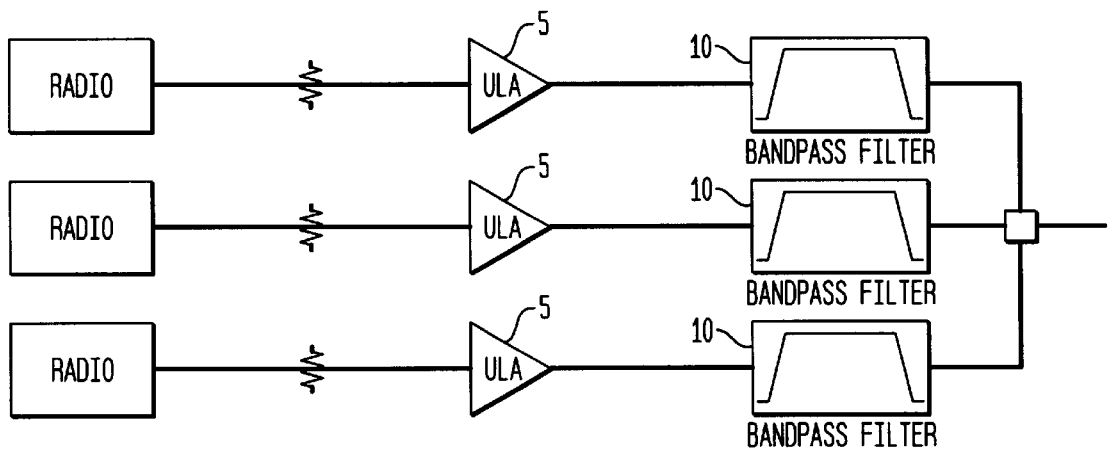
FIGS. 10A–10C show alternate application of the architecture of the invention for U.S. domestic Cellular service.
Figure 10B:
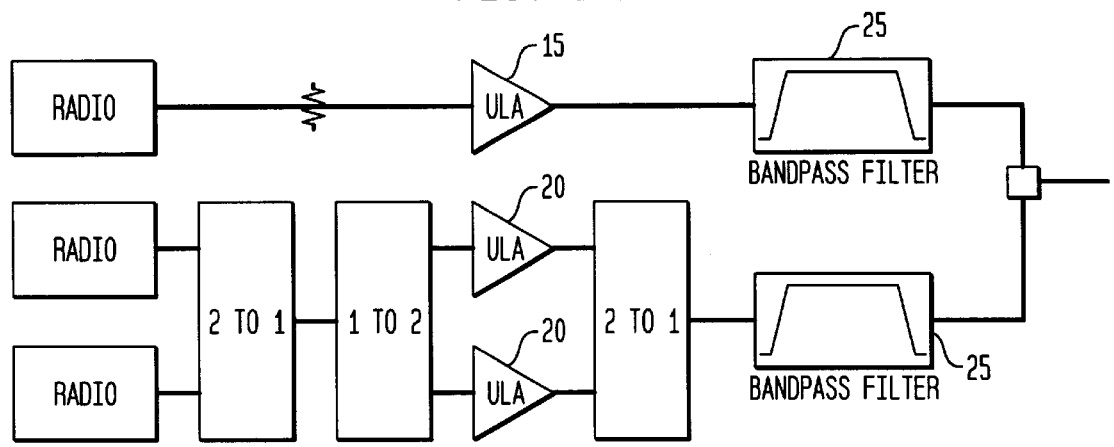
Figure 10C:
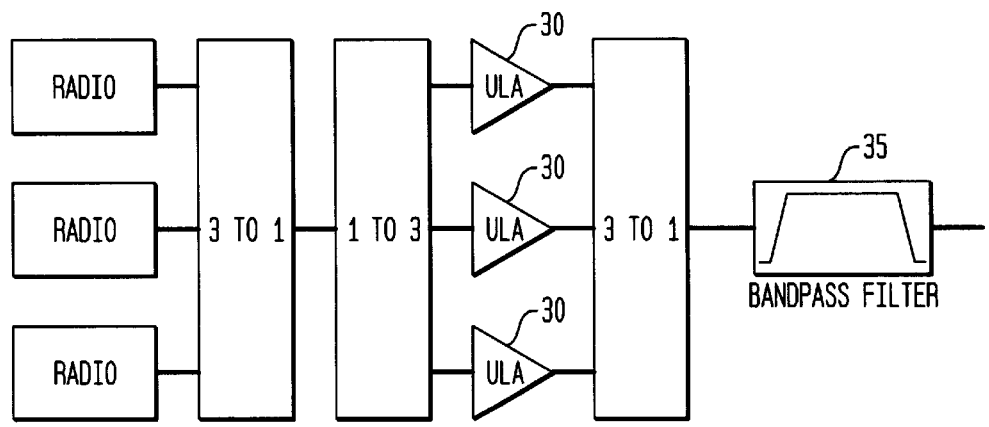

FIG. 10A shows three stand-alone ULA Amplifiers 5 combined together using a triplexer. This configuration is substantially comparable to that used for the narrowband ICLA system shown in FIGS. 3 and 4. Each amplifier requires its own dedicated Filter 10 and the filter passbands must be sufficiently separated to provide adequate isolation in order to keep the combining losses low. FIG. 10B shows one dedicated ULA Amplifier 15 and two 2-carrier ULA Amplifiers 20 combined together with a diplexer, a configuration requiring two Filters 25 for three carriers. Finally, FIG. 10C shows three ULA Amplifiers 30 combined together with each amplifier processing three carriers, this configuration requiring only one Filter 35 for three carriers. As will be apparent from these figures, the number of filters required increases as the number of stand-alone amplifiers increases. Accordingly, it will be preferred to limit the number of stand-alone amplifiers in the system.

Figure 11:
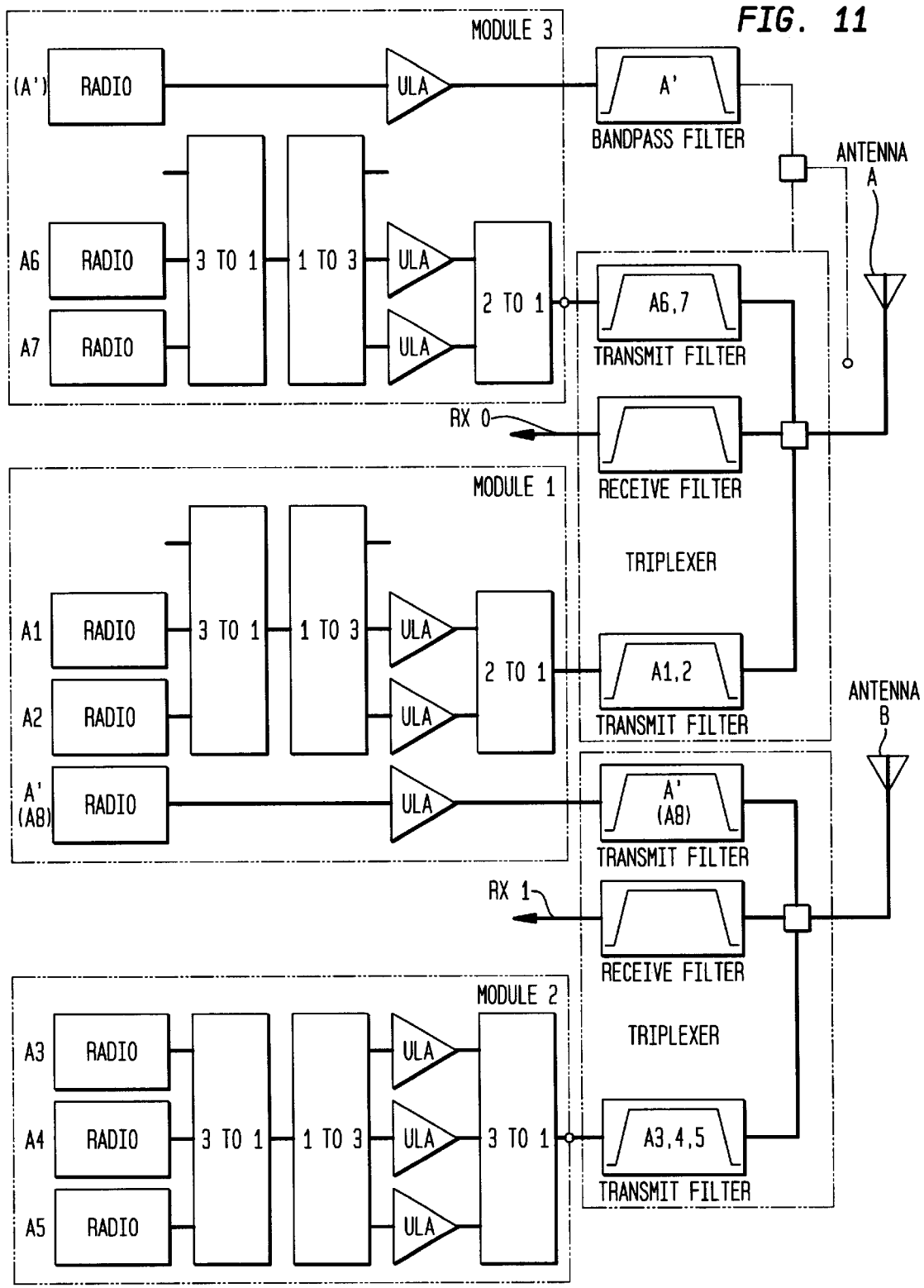
FIG. 11 shows a system implementation according to the method of the invention for A-band domestic Cellular.

FIG. 11 shows a system implementation according to the method of the invention representing an illustrative growth path for an A-band Cellular provider. As shown in the figure, the system utilizes two triplexers, each of which is attached to a separate antenna. The Primary carrier and the first adjacent carrier (A1 and A2) are placed on Antenna A and the Secondary Carrier (A') is placed on Antenna B. The second module adds the next three A-band carriers (A3, A4, A5) on Antenna B. The third module adds the next two A-band carriers (A6 and A7) on Antenna A.

An additional A-band carrier (A8) may be added by first moving the Secondary Carrier (A') and its corresponding filter from Antenna B to Antenna A by using an additional diplexer in front of the triplexer. Carrier A8 and its corresponding filter is then connected to Antenna B in the position previously occupied by the Secondary Carrier (A'). This modification could be made using the architecture of the invention by replacing individual filters within the triplexers, or by replacing the triplexers in their entirety— such a choice being determined by the system growth strategy and the physical implementation of the triplexers.

Figure 12:
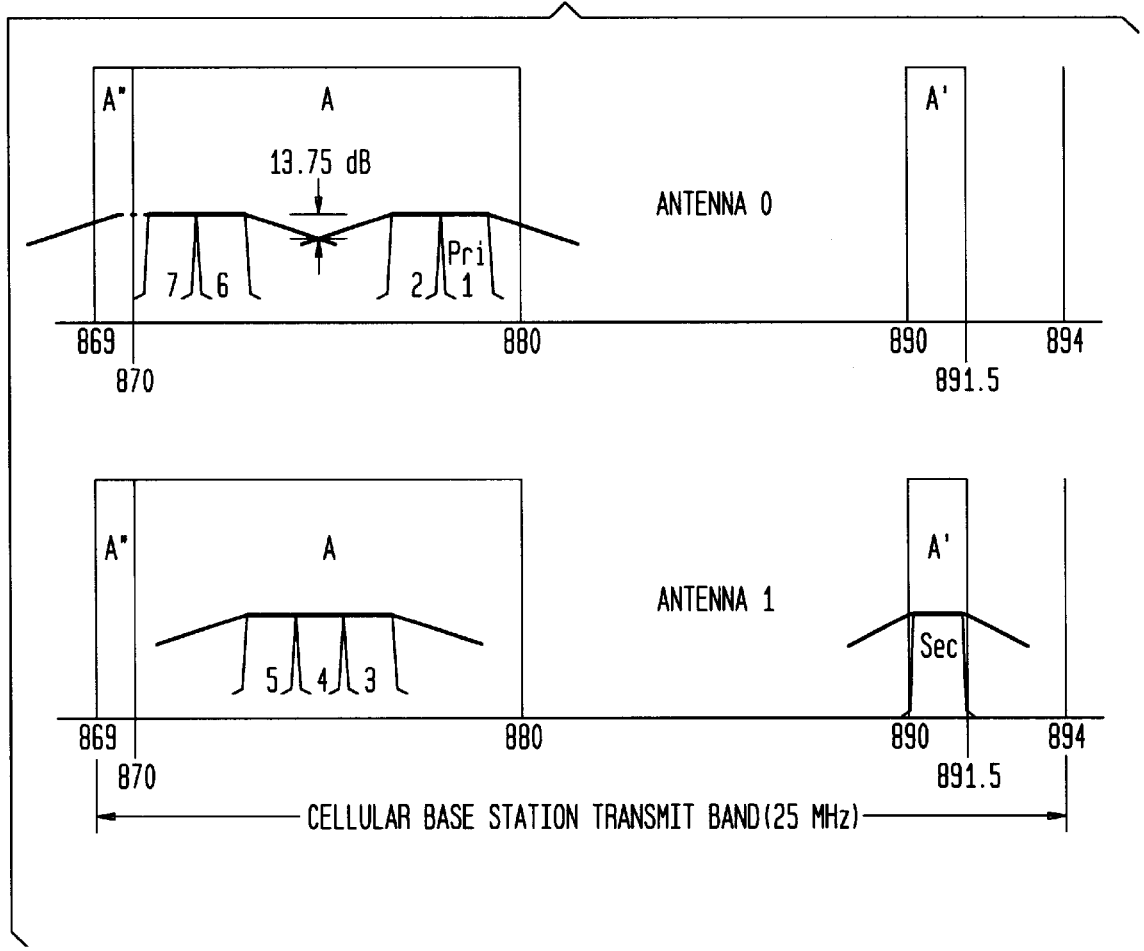
FIG. 12 shows a frequency plan for the system of FIG. 11.

FIG. 12 shows a frequency plan for the system of FIG. 11. Adjacent groups of carriers are placed on different antennas in order to provide sufficient isolation in the triplexers. The individual filter bandwidths are preferably tailored to each group of carriers in order to maximize the isolation in the triplexers. In circumstances where the isolation requirements for the triplexers can be relaxed, or with the use of filters having a steeper roll-off, then all of the filter sections can be designed with the same bandwidth. Other A-band system implementations using different carrier groupings and filter combinations are also possible within the architecture of the invention as long as sufficient filter spacing is maintained in order to provide adequate isolation in the triplexers. Such implementations will be readily apparent to those skilled in the art.

Figure 13:
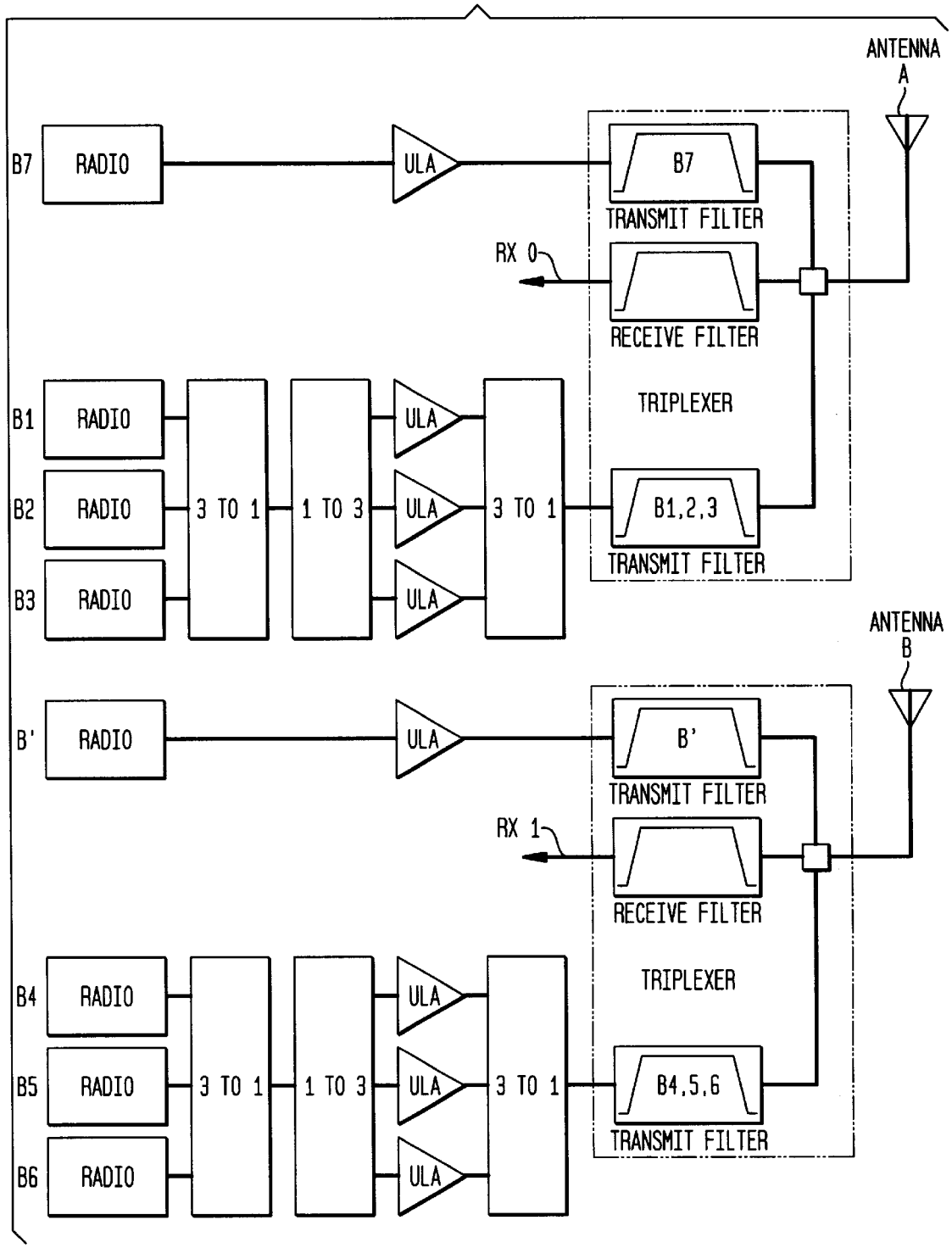
FIG. 13 shows a system implementation according to the method of the invention for B-band domestic Cellular.

FIG. 13 shows an illustrative growth path for a B-band Cellular provider in a system implemented according to the method of the invention. As can be seen in the figure, this configuration is substantially similar to the previously described A-band system depicted in FIG. 11. Implementation of such a system will be readily apparent to those skilled in the art.

FIG. 14 shows a frequency plan for the B-band system of FIG. 11. Adjacent groups of carriers are placed on different antennas in order to provide sufficient isolation in the triplexers. The individual filter bandwidths are preferably tailored to each group of carriers in order to maximize the isolation in the triplexers. In circumstances where the isolation requirements for the triplexers can be relaxed, or with the use of filters having a steeper roll-off, then all of the filter sections can be designed with the same bandwidth. Other B-band system implementations using different carrier groupings and filter combinations are also possible within the architecture of the invention as long as sufficient filter spacing is maintained in order to provide adequate isolation in the triplexers. Such implementations will be readily apparent to those skilled in the art.

III. Another Embodiment—Higher Power Applications

While it is expected that the output power level for the ULA amplifiers incorporated in the architecture of the invention will be optimized for the preponderance of applications for that architecture, there will always be applications which require addition RF transmit power. Because the architecture of the invention employs parallel combinations of the ULA amplifiers, that architecture creates options to increase the output power level of the cell site.

Figure 15A:
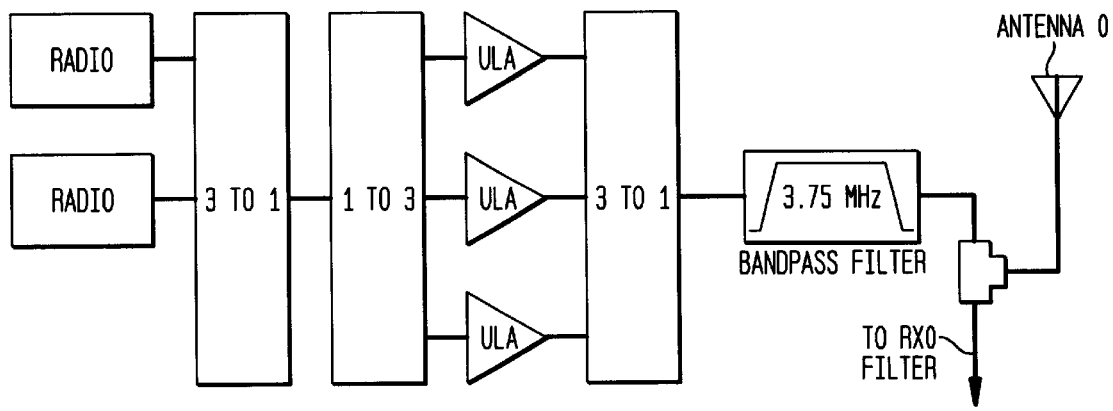
FIG. 15 shows exemplary configurations of parallel ULA amplifiers for providing higher output power per CDMA carrier.
Figure 15B:
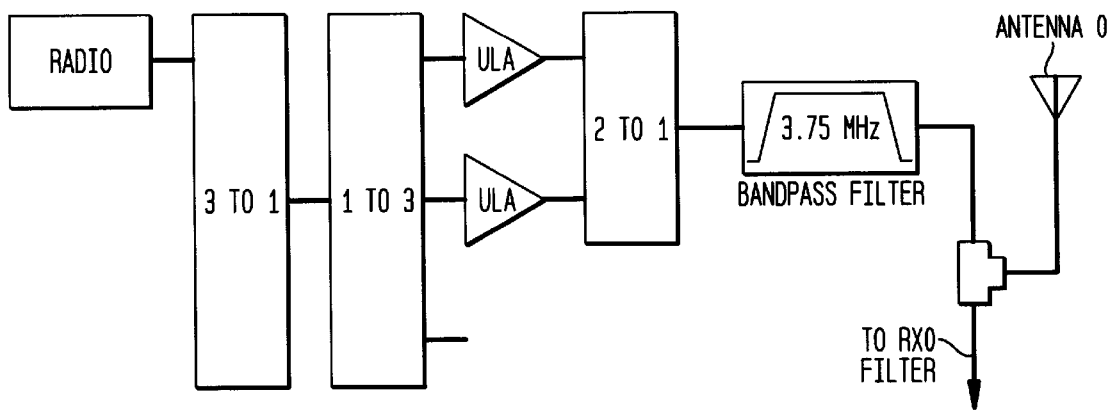
Figure 15C:
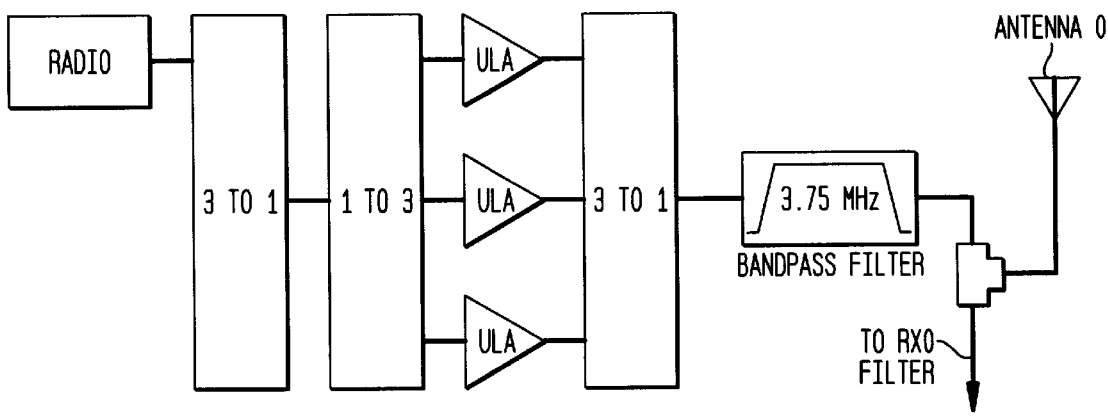

FIG. 15 shows three exemplary configurations of two or three parallel ULA amplifiers which yield a higher output power per CDMA carrier. The output power values shown are based upon a nominal amplifier output power rating of 25 watts and 3 dB of insertion loss between the amplifier outputs and the antenna connector. Note, however, that, while this embodiment utilizes substantially the same ULA architecture as previously described, the increased output power is only available with a reduced carrier count. Such a high-power configuration may be particularly viable for rural applications where higher power is often more important than capacity. Duplexers (rather than triplexers) are used in FIG. 15 to illustrate a simplified, lower cost embodiment suitable for reduced carrier applications. Any of these concepts could be implemented using triplexers or later modified to incorporate triplexers as the system grows. It should be noted that, although the number of paralleled amplifiers is limited to three or less for the illustrated embodiments, any number of amplifiers may be combined in parallel as long as the total occupied bandwidth of the combined signal applied to the amplifiers is within the specified operating bandwidth of the amplifiers.

IV. ULA Amplifier Characteristics

The amplifier chosen for an implementation of the methodology and architecture of the invention should be a highly linear amplifier in order to meet prevailing standards for spurious emissions in multi-carrier CDMA operation. In general, the more carriers there are, and the further apart they are spread in frequency, the more complicated the amplifier becomes. The ULA system combines small groups of carriers in a limited bandwidth in order to lower the cost of the amplifier while retaining high linearity. For a preferred embodiment of the invention, an amplifier based on a design disclosed in U.S. Pat. No. 5,646,574 (entitled "Low Distortion Amplifier Circuit with Improved Output Power" issued Jul. 8, 1997 to R. J. Lisco, W. Liu & J. Moravchik, and assigned to Lucent Technologies) will be utilized. Other embodiments which limit spurious emission requirements over the specified operating bandwidth of the amplifier system are also possible.

CONCLUSION

A novel RF amplifier architecture has been disclosed which provides high performance and modular growth at a lower cost than with a conventional MCLA amplifier approach. The methodology and architecture of the invention operates to combine small groups of closely spaced CDMA carriers.

Although the methodology and architecture of the invention, and illustrative applications of that methodology and architecture, have been described in detail, it should be understood that various changes, alterations, and substitutions can be made therein without departing from the spirit and scope of the invention as defined by the appended claims. In particular, while the configurations described herein were concentrated on basic groups of three carriers—such a grouping fitting well into the domestic Cellular and PCS frequency spectrum allocations while allowing for modular growth, other carrier groupings may be applied for other applications. Such groupings will be apparent to those skilled in the art.

What is claimed is:

1. In a wireless communications system operable to transmit modulated carrier signals from a base station to served wireless stations, a method for grouping carriers into one or more subsets of available carriers in said system to effect a reduction in a number of transmitting antennas required for said system, said method comprising the steps of:

selecting a first subset of carriers to include at least two of said available carriers;

combining modulated carrier signals corresponding to said selected subset of carriers into a single RF signal stream;

dividing that single RF signal stream among inputs of a plurality of RF power amplifiers;

causing output signals from said plurality of RF power amplifiers to be combined into one amplified RF signal;

bandpass filtering said one amplified RF signal; and applying said filtered signal to a transmitting antenna;

selecting at least one additional subset of carriers to include at least one of said available carriers remaining after selection of said first subset of carriers;

iteratively repeating said combining, said dividing, said causing and said filtering steps for said at least one additional subset and applying an output of said filtering step to said transmitting antenna.

2. The method of claim 1 wherein said step of bandpass filtering operates to provide spurious rejection within a filter stopband sufficient to reduce overall spurious emissions of said wireless communications system to a predetermined level.

3. The method of claim 2 wherein said predetermined level to which said overall spurious emissions are reduced is selected to be consistent with system requirements outside occupied signal bandwidths for channelized RF carriers in said wireless communications system.

4. The method of claim 1 wherein said step of bandpass filtering operates to provide a passband/stopband transition region sufficient to provide signal isolation among filters associated with a common transmitting antenna.

5. The method of claim 1 wherein said plurality of RF power amplifiers are established in a cooperative relationship with said bandpass filtering in order to provide amplified output signals meeting in-band spurious emission requirements.

6. The method of claim 1 wherein at least one of said plurality of RF power amplifiers is operative to amplify a single carrier such that an output thereof will meet out-of-band spurious emission requirements without additional filtering.

7. The method of claim 1 wherein said served wireless stations may be fixed or mobile.

8. In a wireless communications system operable to cause modulated RF signals to be transmitted from a base station to served fixed or mobile stations, an architecture for implementation of said RF signal transmission comprising:

a first combiner operable to receive outputs from a plurality of sources of said modulated RF signals and to produce as an output thereof one combined RF signal;

a signal splitter operable to receive said output of said combiner and to provide as an output thereof a plurality of copies of said combined RF signal;

at least one RF amplifier operable to receive as an input ones of said outputs of said signal splitter and to provide as an output an amplified version of the input signal;

a second combiner operative to receive as inputs the outputs of said at least one RF amplifier and to provide as an output thereof one combined amplified RF signal; and a bandpass filter operative to receive said combined amplified RF signal and to provide as an output thereof a signal to a transmitting antenna;

wherein said RF amplifiers are selected to meet a set of predetermined spurious emission requirements and further wherein said RF amplifiers are established in a cooperative relationship with said bandpass filter in order to provide amplified output signals meeting in-band spurious emission requirements.

9. The wireless system architecture of claim 8 wherein said RF amplifier is enabled to operate over a reduced instantaneous signal bandwidth, thereby achieving a reduction in amplifier complexity.

10. The wireless system architecture of claim 8 including at least two RF amplifiers operable to receive as an input ones of said outputs of said signal splitter, wherein each of said at least two RF amplifiers operates to amplify a common group of signals, said common group of signals occupying an instantaneous bandwidth for which said RF amplifiers are designed to operate.

11. A method for processing RF carriers in a wireless communications system comprising the steps of:

operating on outputs of one or more modulated RF signal sources to combine said outputs into a single RF signal stream;

dividing that single RF signal stream among inputs of a plurality of RF power amplifiers;

causing output signals from said plurality of RF power amplifiers to be combined into one amplified RF signal; and bandpass filtering said one amplified RF signal;

wherein said RF power amplifiers are established in a cooperative relationship with said bandpass filtering in order to provide amplified output signals meeting in-band spurious emission requirements.

12. The method for processing RF carriers of claim 11 wherein RF signals from said one or more modulated RF signal sources are arranged in a frequency spectrum so as to minimize spurious emissions generated in said system falling into a signal passband of said filter.

13. The method for processing RF carriers of claim 11 wherein a number of RF signal sources operated by said operating step is reduced relative to a number of RF power amplifiers constituting said plurality of RF power amplifiers, thereby providing a higher transmission power for said reduced number of RF signal sources.

* * * * *